United States Patent [19]
Misono

[11] Patent Number: 5,447,266
[45] Date of Patent: Sep. 5, 1995

[54] MOUNTING APPARATUS FOR MOUNTING CHIP COMPONENT ON MOUNTING PORTION AND METHOD FOR CONTROLLING LOAD ON CHIP COMPONENT

[75] Inventor: Hiroshi Misono, Mobara, Japan

[73] Assignee: Kabushiki Kaisha Toshiba, Kawasaki, Japan

[21] Appl. No.: 159,311

[22] Filed: Nov. 30, 1993

[30] Foreign Application Priority Data

Dec. 1, 1992 [JP] Japan ................................ 4-321984

[51] Int. Cl.$^6$ ............................................. H01L 21/60
[52] U.S. Cl. ..................... 228/102; 228/6.2; 228/8; 228/233.1
[58] Field of Search ............... 228/102, 6.2, 8, 180.21, 228/233.1

[56] References Cited

U.S. PATENT DOCUMENTS

| | | | |
|---|---|---|---|
| 4,444,349 | 4/1984 | Bilane et al. | 228/102 |
| 4,789,095 | 12/1988 | Kobayashi | 228/102 |
| 5,060,841 | 10/1991 | Oshima et al. | 228/9 X |
| 5,207,370 | 5/1993 | Mochida et al. | 228/102 |
| 5,285,946 | 2/1994 | Tomigashi et al. | 228/6.2 X |
| 5,351,872 | 10/1994 | Kobayashi | 228/6.2 |

OTHER PUBLICATIONS

Kobayashi et al Patent Abstracts of Japan 62-271537 May 1, 1989.

*Primary Examiner*—Kenneth J. Ramsey
*Attorney, Agent, or Firm*—Finnegan, Henderson, Farabow, Garrett & Dunner

[57] ABSTRACT

A collet for holding a die with a vacuum force is provided with a linear motor. At the time of bonding the die to a lead frame, a control unit controls the linear motor to mount the die, held by the collet, onto the mounting portion of the lead frame. At this time, the control unit gradually increases the torque of the linear motor to gradually press the die. This reduces the impact load applied to the die, preventing the die from being cracked.

17 Claims, 6 Drawing Sheets

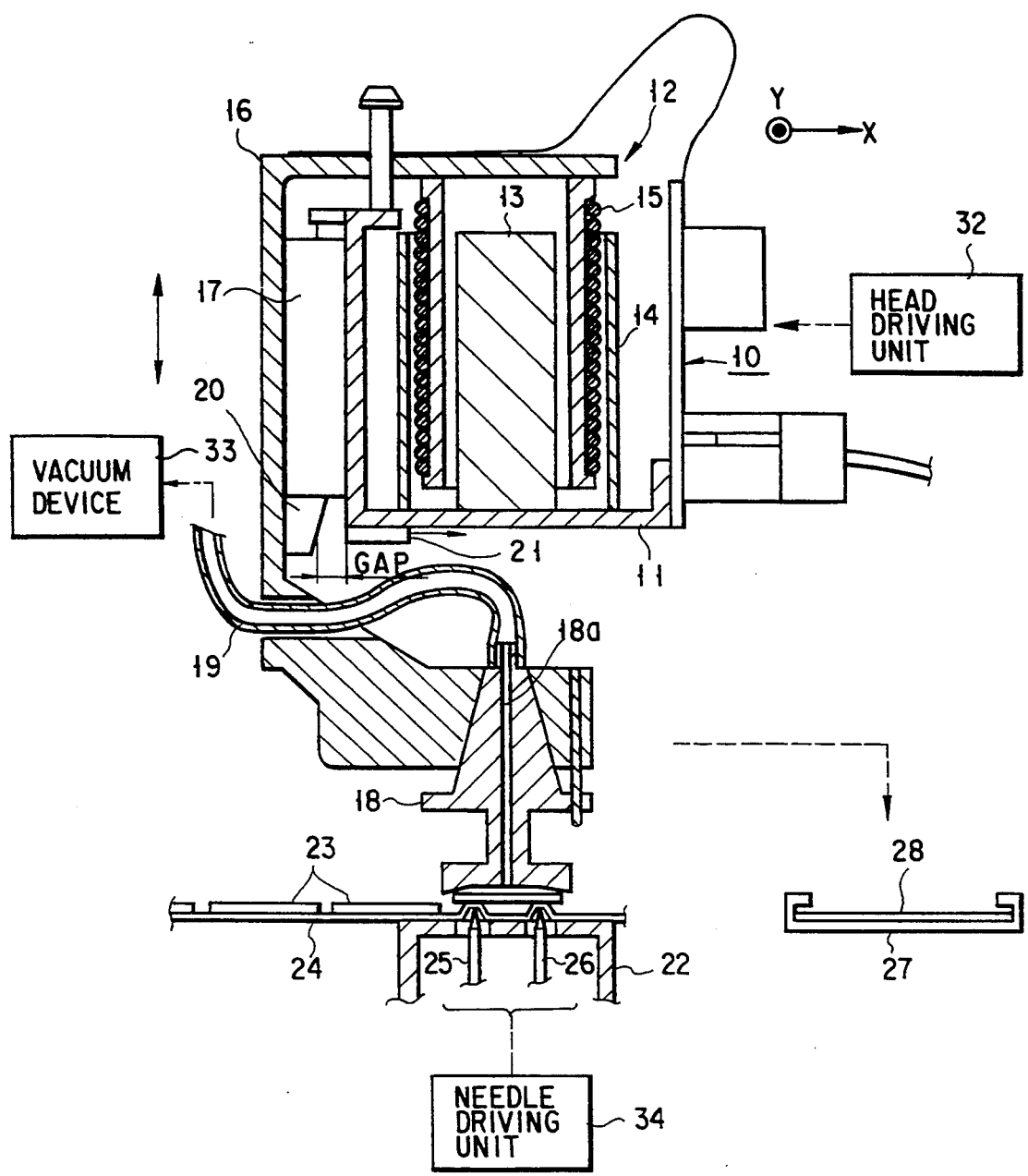
F I G. 2

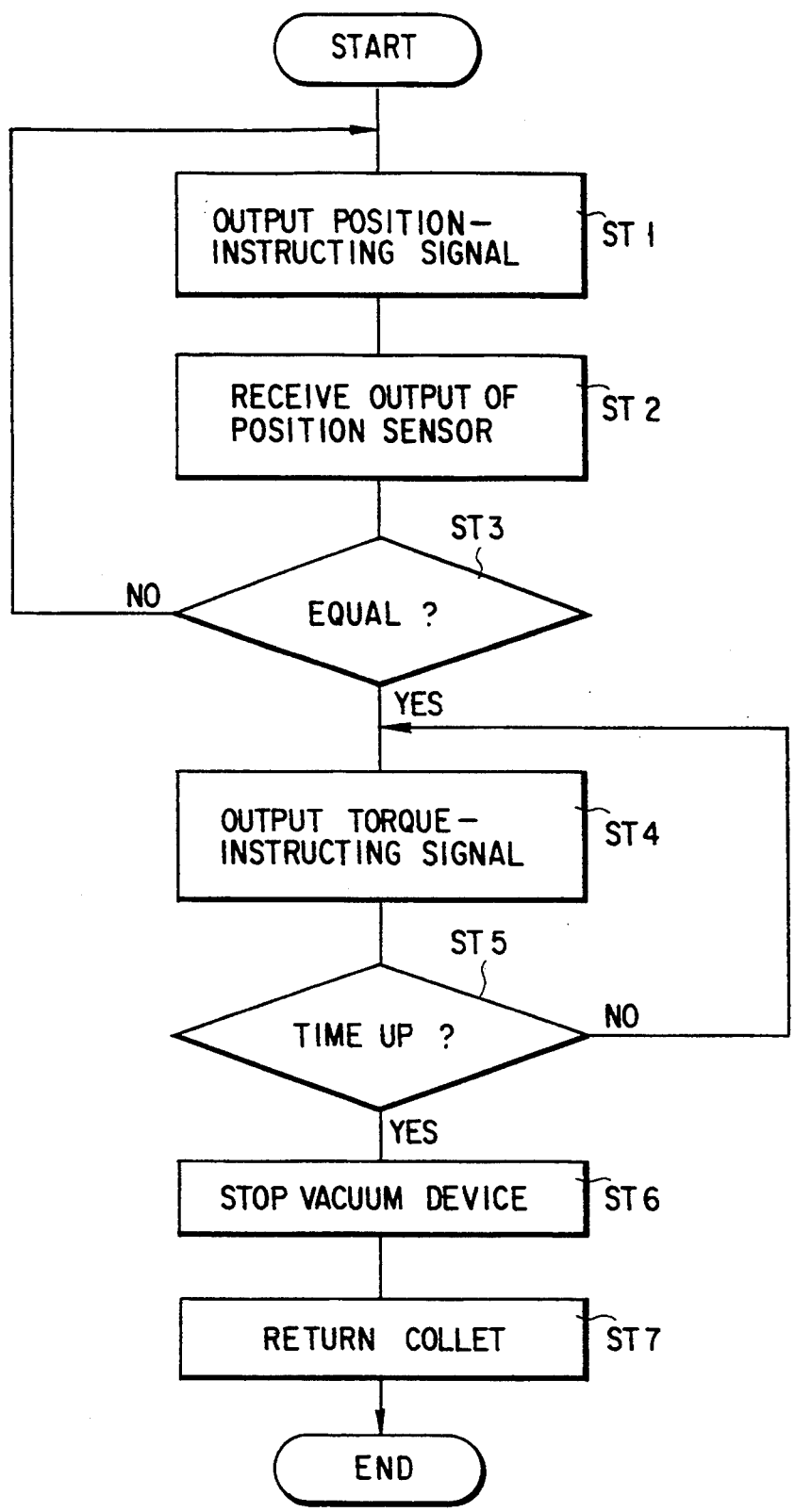
F I G. 4

MOUNTING APPARATUS FOR MOUNTING CHIP COMPONENT ON MOUNTING PORTION AND METHOD FOR CONTROLLING LOAD ON CHIP COMPONENT

BACKGROUND OF THE INVENTION

1. Field of the Invention

This invention relates to a mounting apparatus for mounting a chip component, such as a semiconductor chip, onto the mounting portion of a lead frame, and a method for controlling the load on the chip component.

2. Description of the Related Art

FIG. 7 shows a conventional mounting apparatus, for example, a die bonding apparatus. An arm 61 has a table 61a, on which a motor 62 is mounted. The motor 62 has an axis 62a of rotation, to which a screw 63 is directly secured. A collet head 64 is mounted on the screw 63. Thus, the motor 62 can move the collet head 64 in the vertical direction.

The collet head 64 has a main body 64a, in which a collet shaft 65 is inserted such that it is movable in the vertical direction. A stopper 66a is provided on an upper portion of the collet shaft 65, and a collet 73 for holding a semiconductor chip (hereinafter called a "die") 72 with the use of a vacuum chuck is provided on a lower portion of the same. Further, an engagement member 66b is provided on a lower portion of the shaft 65, and a spring 69 is interposed between the main body 64a of the collet head 64 and the engagement member 66b.

A gap sensor 70 is provided on an upper portion of the collet head 64 when the die 72 is out of contact with a lead frame 71, the collet shaft 65 is urged by the spring 69 downward as indicated by arrow-A. Accordingly, the stopper 66a contacts the gap sensor 70. At the time of bonding, the motor 62 is driven to lower the collet head 64, thereby bringing the die 72 into contact with the lead frame 71 coated with a paste 74. Further lowering the collet head 64 will cause a deviation in position between the collet head 64 and the collet shaft 65, since the collet shaft 65 is kept stopped during the further lowering operation. This causes a gap between the gap sensor 70 and the stopper 66a. As this time, the gap sensor 70 senses that the die 72 has contacted the lead frame 71. Rotating the motor 62 for a predetermined amount causes the die 72 to press the lead frame 71.

The above-described conventional die bonding apparatus determines whether or not the die 72 has contacted the lead frame 71, on the basis of whether or not the gap sensor 70 contacts the stopper 66a. In this case, however, unless the spring 69 is contracted to some extent after the die 72 has contacted the lead frame 71, the stopper 66a is not separated from the gap sensor 70. As a result, the initial impact load applied to the die 72 is not small. Further, it is difficult to finely control the load applied thereto by motor rotation control. Accordingly, it is liable that the die 72 is cracked, degrading its quality.

SUMMARY OF THE INVENTION

It is the object of the invention to provide a chip component mounting apparatus capable of reducing the impact load applied on a chip component to thereby prevent degradation of the quality of the chip component.

To attain the object, there is provided a mounting apparatus for mounting a chip component on a mounting portion of a base member, comprising:

holding means for holding the chip component; moving means for moving the holding means toward the mounting portion of the base member; and control means connected to the moving means, the control means gradually increasing the torque of the moving means to thereby gradually increase a load applied to the chip component, at the time of mounting the chip component held by the holding means, onto the mounting portion of the base member.

In the above structure, at the time of mounting the chip component, held by the holding means, onto the mounting portion of the base member and pressing the same, the torque of the linear motor is gradually increased to gradually increase the load applied to the chip component. This can reduce the impact load applied to the chip component, preventing the component from being cracked.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 2 is a sectional view, showing the die bonding apparatus according to the embodiment;

FIG. 4 is a flowchart, useful in explaining the operation of a control unit shown in FIG. 1;

DETAILED DESCRIPTION OF THE PREFERRED EMBODIMENT

Figure 1:
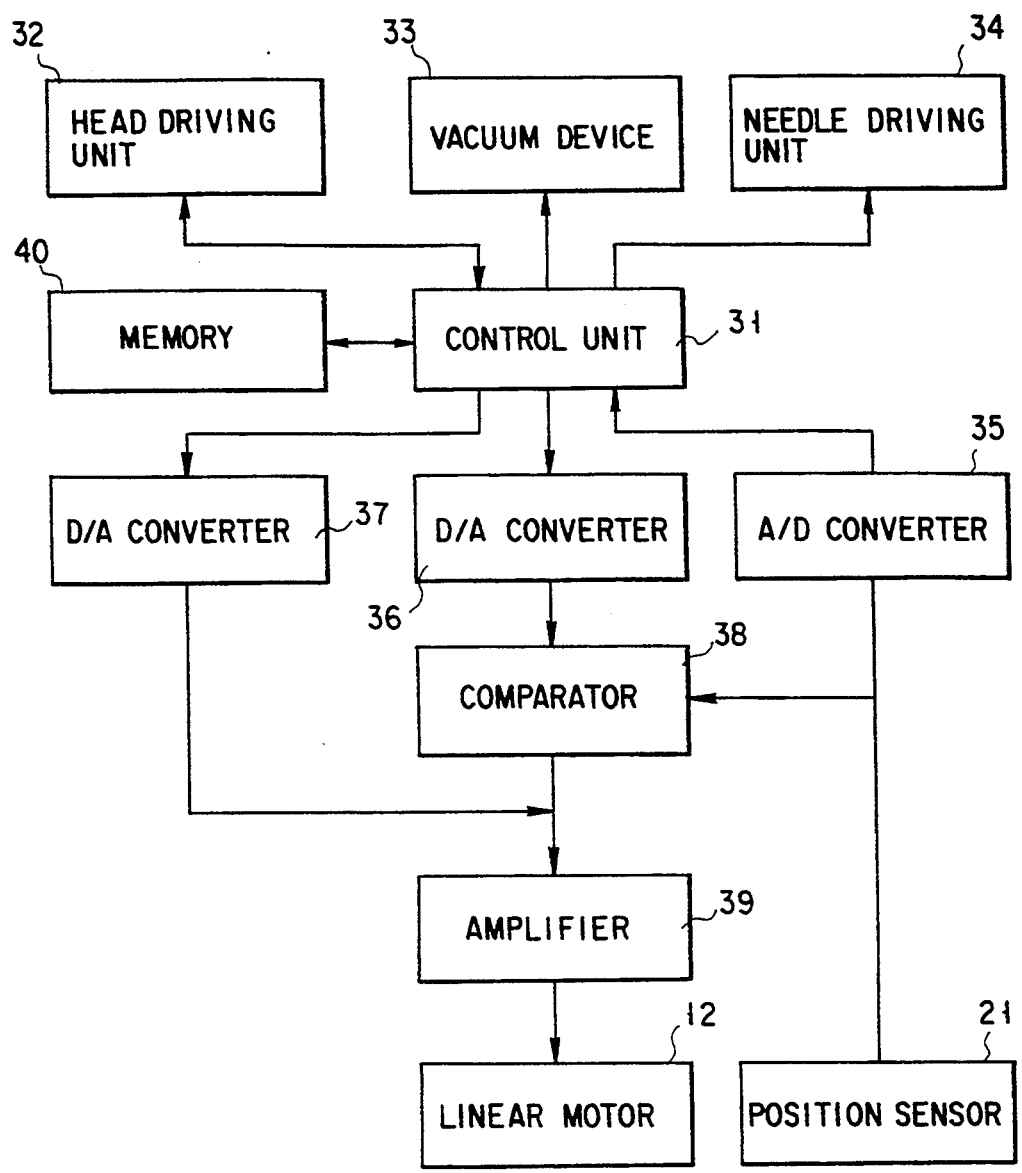
FIG. 1 is a block diagram, showing a control circuit employed in a die bonding apparatus according to an embodiment of the invention.

The embodiment of the invention will be explained with reference to the accompanying drawings.

FIG. 2 shows a die bonding apparatus, to which the present invention is applied.

As is shown in FIG. 2, a head 10 is mounted on a head driving unit 32 constituted by a rectangular coordinate-type robot, and can be moved by the unit 32 in X- and Y-directions. The head 10 has a frame 11, and a voice coil-type linear motor (hereinafter called simply a "linear motor") 12 is provided on the upper surface of the frame 11. The linear motor 12 comprises a cylindrical magnet 13 fixed to the frame 11, a cylindrical magnet 14 surrounding the magnet 13 and separated therefrom, and a voice coil 15 movable between the magnets 13 and 14.

The collet head 16 has an end thereof attached to the voice coil 15, and an intermediate portion attached to a linear guide bearing 17 which is fixed to the frame 11. Thus, the voice coil 15 and the collet head 16 can be moved in the vertical direction by controlling current supplied to the voice coil 15.

A collet 18 forming a vacuum chuck is provided through the other end of the collet head 16, and has a through hole 18a extending from the upper end to the lower end thereof. A pipe 19 has an end which is secured to the upper surface of the collet 18 such that it communicates with the through hole 18a, and has the other end connected to a vacuum device 33.

A target 20 consisting of e.g. a magnet is mounted on an intermediate portion of the collet head 16, and a position sensor 21 consisting of a Hall element is mounted on the bottom surface of the frame 11, opposed to the target 20. The surface of the target 20 which is opposed to the position sensor 21 inclines such that the gap therebetween is larger at a lower portion of the target 20 than at an upper portion thereof. Accordingly, moving the collet 16 in the vertical direction varies the gap. The position sensor 21 senses the gap on the basis of a change in magnetic force, thereby determining the position of the collet head 16.

A back-up member 22 is provided under the lower surface of the collet 18. A sheet 24 to which a plurality of dies 23 are attached can be inserted between the collet 18 and the back-up member 22. The dies 23 attached to the sheet 24 can be thrusted up and peeled off the sheet 24 by means of needles 25 and 26 which project from the back-up member 22. The needles 25 and 26 are driven by a needle driving unit 34. Further, a guide rail 27 is provided in the vicinity of the back-up member 22, for guiding a lead frame 28.

At the time of sucking the die 23 by the collet 18, first, the linear motor 12 is driven to lower the collet 18 to a predetermined position which is higher by the thickness of the die 23 than a waiting position (hereinafter called an "origin") of the collet 18. Then, the needles 25 and 26 are thrusted from the back-up member 22 to the die 23. At the same time, the collet 18 is raised and the vacuum device is driven. As a result, the die 23 thrusted by the needles 25 and 26 is attracted by the collet 18. Then, the collet 18 is raised to the origin. Thereafter, the head 10 is moved to the lead frame 28 by means of the head driving unit 32, thereby lowering the collet 18 to bond the die 23 to the lead frame 28. The bonding operation will be explained in detail later.

FIG. 1 shows a control circuit incorporated in the die bonding apparatus. A control unit 31 constituting, for example, of a microcomputer controls the overall operation of the apparatus. The control unit 31 is connected to the head driving unit 32 for moving the head 10 in the X- and Y-directions, the vacuum device 33 and the needle driving unit 34. Further, the control unit 31 is connected to the position sensor 21 via an A/D converter 35, for receiving a position signal from the sensor 21 via the converter 35.

Moreover, the control unit 31 is connected to D/A converters 36 and 37. The D/A converter 36 receives a digital position-instructing signal from the control unit 31, and converts it into an analog signal. The D/A converter 37 receives a digital torque-instructing signal from the control unit 31, and converts it into an analog signal. The output terminal of the D/A converter 36 is connected to one of the input terminals of a comparator 38. The other input terminal of the comparator 38 is connected to the position sensor 21. The output terminal of the comparator 38 is connected to the output terminal of the D/A converter 37 and to the input terminal of an amplifier 39, and the output terminal of the amplifier 39 is connected to the linear motor 12. The control unit 31 has a memory 40 which pre-stores a position instruction data and a torque instruction data.

Figure 3:
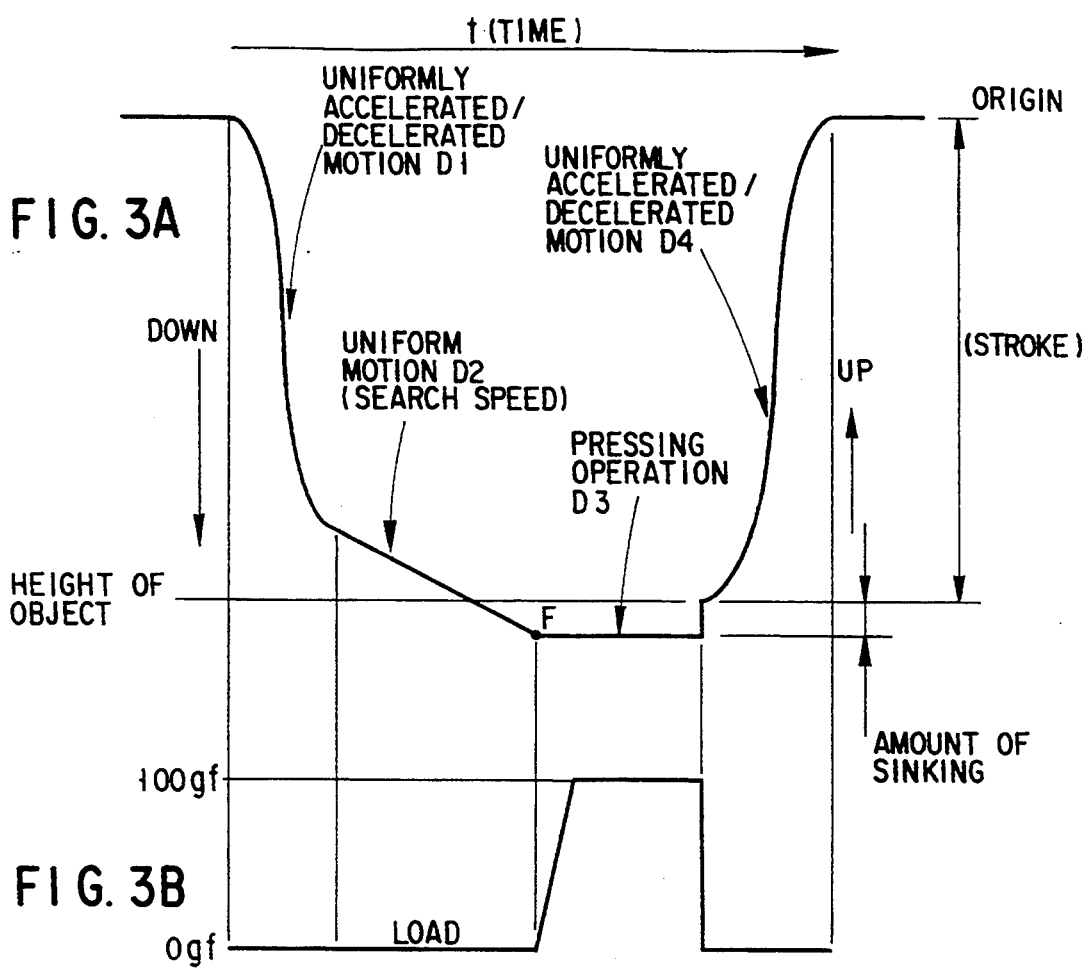
FIG. 3A is a graph, useful in explaining the operation of the apparatus.
FIG. 3B is a graph, useful in explaining the pressing operation of the apparatus.

The operation of the die bonding apparatus constructed as above will now be explained with reference to FIGS. 3A, 3B and 4. FIG. 3A shows the operation performed at the time of bonding a die, held by the collet 18, onto the lead frame.

As is described above, the collet 18 with the die 23 is positioned in the origin shown in FIG. 3A. First, the apparatus performs uniformly accelerated/decelerated motion D1 to lower the collet 18 to a position in which it does not contact the lead frame 28; and then performs uniform motion D2 to place the die 23 onto that bonding or mounting portion (not shown) of the lead frame 28 which is coated with paste, while sensing the surface of the lead frame 28. When the die 23 has been placed on the lead frame 28, a pressing operation D3 is performed to the lead frame 28 for a predetermined period of time. In the pressing operation, current and voltage applied to the linear motor 12 are gradually increased with lapse of time. Accordingly, the load applied to the die 23 gradually increases, as is shown in FIG. 3B. The load spreads the paste between the die 23 and the lead frame 28, with the result that the die 23 is adhered to the frame 28. Thereafter, the die 23 is released from the collet 18, which is then raised to the origin by uniformly accelerated/decelerated motion D4.

FIG. 4 shows the operation of the control unit 31 performed at the time of bonding a die to the lead frame. The position-instruction data stored in the memory 40 is data for driving the linear motor 12 in accordance with the control characteristics shown in FIG. 3A. The position-instruction data is digitized data corresponding to a position signal output from the position sensor 21 at regular intervals of time, e.g., every 0.8 ms. Further, the torque-instruction data is digital data preset in accordance with the press characteristics shown in FIG. 3B.

Referring again to FIG. 4, at the time of performing the uniformly accelerated/decelerated motion D1 and the uniform motion D2 to lower the collet 18 with the die held thereon, a signal corresponding to the position-instruction data stored in the memory 40 of the control unit 31 is output every 0.8 ms to the D/A converter 36 (ST1). The D/A converter 36 converts the position-instructing signal into an analog signal, and supplies it to the comparator 38. The comparator 38 compares the output signal of the position sensor 21 with the output signal of the D/A converter 36, and outputs a voltage corresponding to the difference therebetween. The output voltage of the comparator 38 is supplied to the linear motor 12 via the amplifier 39, with the result that the linear motor 12 is operated in accordance with the output of the amplifier 39. Thus, the collet 18 with the die 23 is lowered.

On the other hand, the control unit 31 receives a signal output from the position sensor 21, for example, every 0.8 ms, and determines based on the received signal whether or not the die 23 has been placed onto the bonding portion of the lead frame 28 which is coated with paste (ST2, ST3). In other words, the control unit 31 determines whether or not the output signal of the position sensor 21 has a constant level within a predetermined range of time. While the level of the output signal of the position sensor 21 is varying, the control unit 31 determines that the die 23 has not yet been placed on the bonding portion, thereby outputting a position-instructing signal. When the level of the output signal has become constant, the control unit 31 determines that the die 23 has been placed on the lead frame 28.

When having detected the placement of the die 23 on the frame 28, the control unit 31 stops the output of the position-instructing data, and reads a torque-instruction data from the memory 40, for example, every 0.8 ms, thereby supplying the D/A converter 37 with the torque-instruction data (ST4). The D/A converter 37 converts the torque instructing signal into an analog signal, and supplies the analog signal to the linear motor 12 via the amplifier 39. The die 23 is gradually pressed until the load applied thereon reaches a set value. This pressing operation is continued for a predetermine period of time (ST5), and the operation of the vacuum device 34 is stopped after the predetermined time period elapses (ST6), thereby returning the collet 18 to the origin (ST7). At the time of returning the collet, the control unit 31 reads the position-instruction data from the memory as described above, and supplies the linear motor 12 with an error signal between a signal corresponding to the position-instruction data and the output signal of the position sensor 21, so as to drive the motor.

Figure 5:
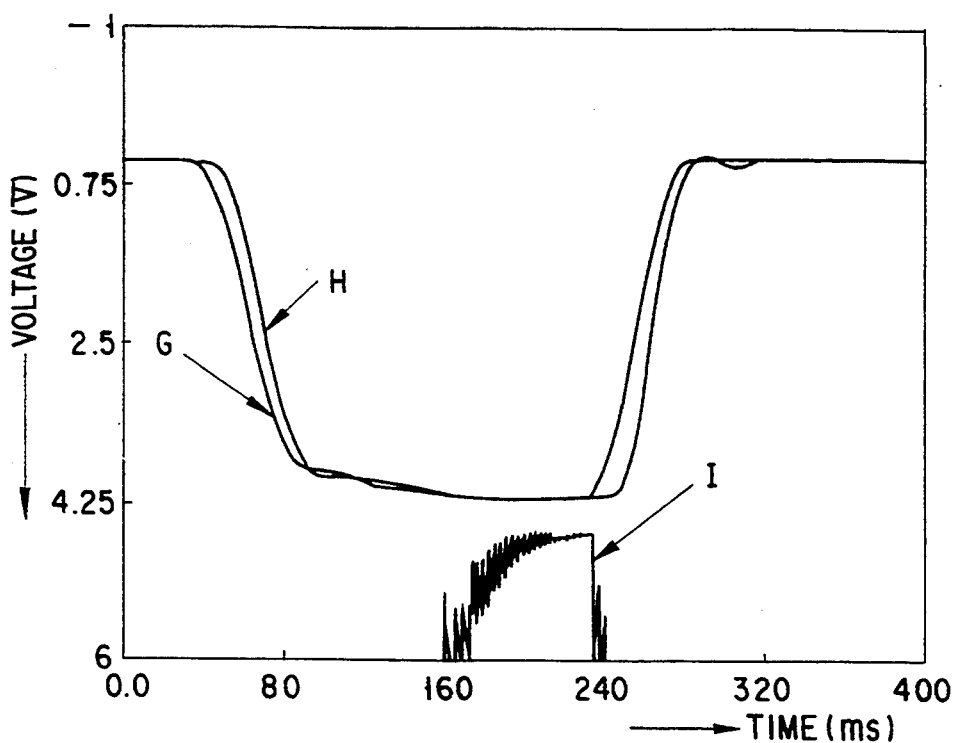
FIG. 5 is a graph, showing changes in load obtained when the pressing method of the invention is used.
Figure 6:
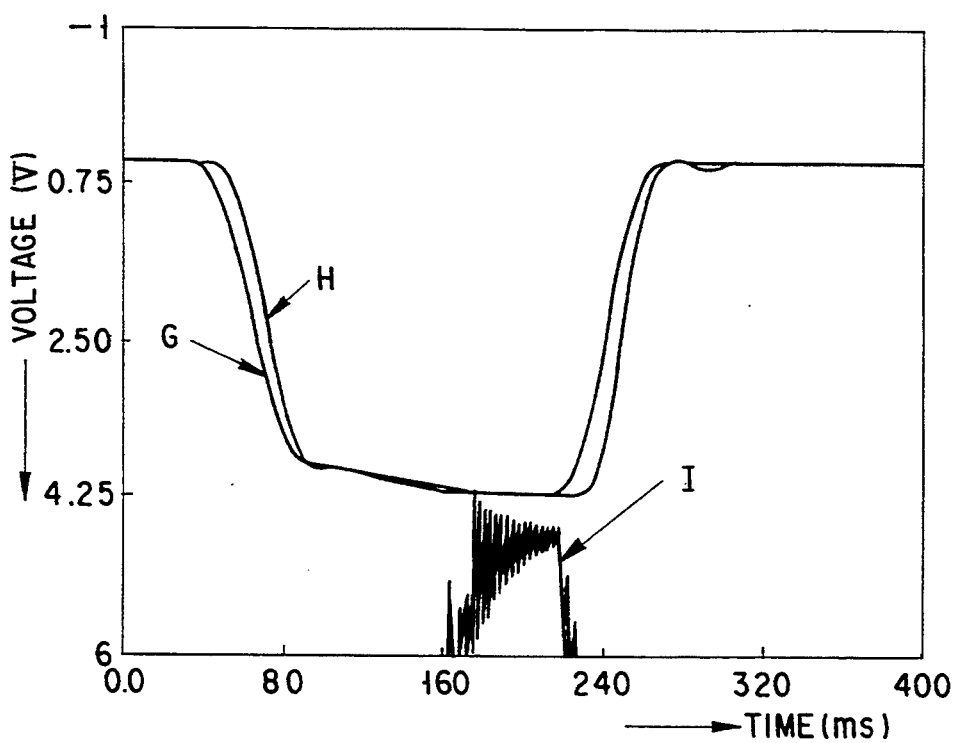
FIG. 6 is a graph, showing changes in load obtained when a pressing method differing from the present invention is used.
Figure 7:
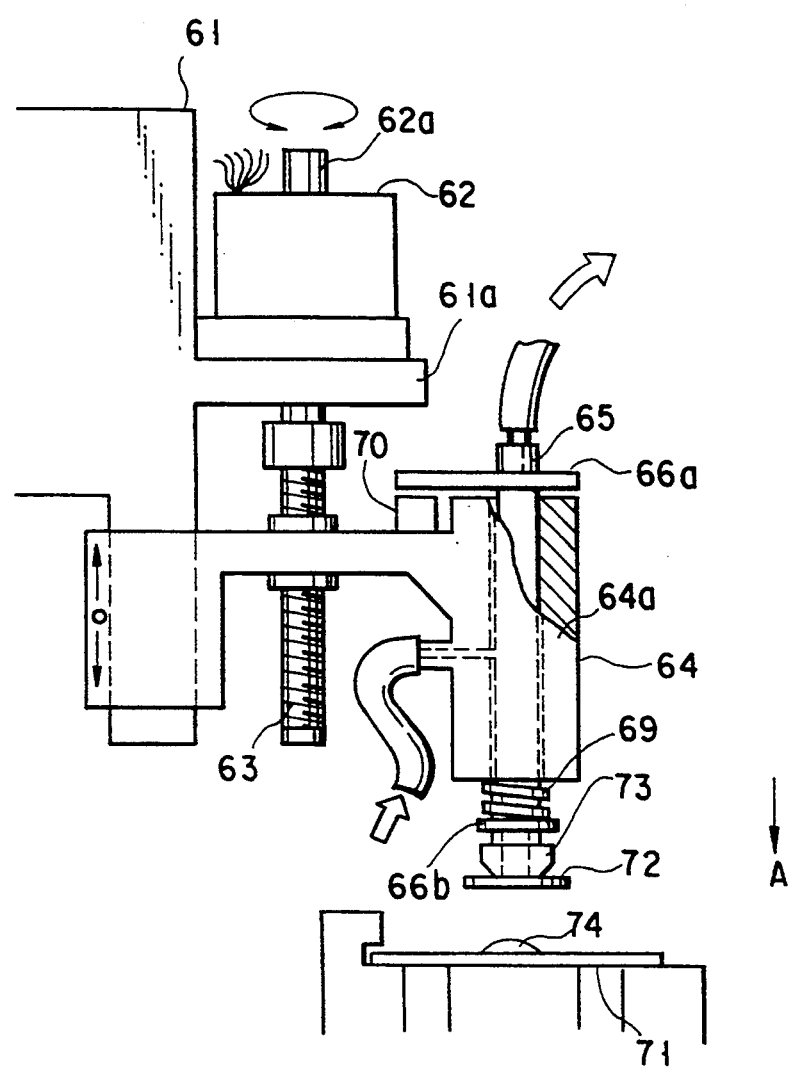
FIG. 7 is a sectional view, showing a conventional die bonding apparatus.

FIGS. 5 and 6 are graphs, showing the loads applied in the above-described apparatus at the time of bonding, and measured with the use of a compact load converter. FIG. 5 shows a case where the die is gradually pressed as in the above embodiment, while FIG. 6 shows a case where the set load is applied to the die at a time. In FIGS. 5 and 6, G indicates the position-instructing signal, H the output signal of the position sensor, and I measurement results obtained with the use of a compact load converter. In the measurement, the speed of the uniform motion D2 (called the "search speed") was 5 mm/s, and the load applied to the die was 100 g.

In the case of FIG. 5, since the die was gradually pressed, the maximum impact load was 100.8 g. On the other hand, in the case of FIG. 6, since the die was pressed at a time, the maximum impact load was as much as 129.5 g.

As evident from the above, since the impact load applied to the die can be reduced in the present invention, the die can be prevented from being cracked, thus avoiding degradation of quality. Therefore, the present invention is advantageously applicable to the case of mounting a GaAs pellet, etc., which can easily be cracked.

Moreover, since in the present invention, the torque of the linear motor is controlled with the use of a digital torque-instructing signal output from the control unit 31, fine press control can be performed in a simple manner.

Although in the above embodiment, the present invention is applied to a die bonding apparatus, it is not limited to the apparatus, but is also applicable to a mounting apparatus for mounting chip components onto a printed wiring substrate.

It is a matter of course that the invention can be modified without departing from the scope thereof.

What is claimed is:

1. A mounting apparatus for mounting a chip component on a mounting portion of a base member, comprising:
   holding means for holding the chip component;
   moving means for moving the holding means toward the mounting portion of the base member; and
   control means connected to the moving means, the control means gradually increasing the torque of the moving means to thereby gradually increase a load applied to the chip component, at the time of mounting the chip component held by the holding means, onto the mounting portion of the base member, said control means being independent of the load applied to the chip component.

2. The apparatus according to claim 1, wherein the holding means comprises a vacuum chuck for sucking the chip component.

3. The apparatus according to claim 1, wherein the drive means comprises a linear motor.

4. The apparatus according to claim 3, wherein the linear motor is of a voice-coil type.

5. A mounting apparatus for mounting a chip component on a mounting portion of a base member, comprising:
   holding means for holding the chip component;
   a linear motor for moving the holding means toward the mounting portion of the base member;
   memory means for storing torque control data to be used to control the torque of the linear motor; and
   control means, connected to the linear motor and the memory means, for gradually increasing the torque of the linear motor in accordance with a torque control signal read from the memory means, to gradually increase a load applied to the chip component, at the time of mounting the chip component held by the holding means, onto the mounting portion of the base member, said control means being independent of the load applied to the chip component.

6. The apparatus according to claim 5, wherein the holding means comprises a vacuum chuck for sucking the chip component.

7. The apparatus according to claim 5, wherein the linear motor is of a voice-coil type.

8. A mounting apparatus for mounting a chip component on a mounting portion of a base member, comprising:
   holding means for holding the chip component;
   a linear motor for moving the holding means toward the mounting portion of the base member;
   sensing means for sensing the position of the holding means relative to the mounting portion of the base member;
   first memory means for storing position control data to be used to control the position of the linear motor;
   second memory means for storing torque control data to be used to control the torque of the linear motor; and
   control means for controlling the linear motor in accordance with the position control data read from the first memory means and the torque control data read from the second memory means, the control means determining, at the time of mounting the chip component held by the holding means onto the mounting portion of the base member, whether or not the chip component on the holding means has contacted the mounting portion of the base member on the basis of a signal indicative of the position of the holding means output from the sensing means and the position control data read from the first memory means, the control means gradually increasing the torque of the linear motor in accordance with a torque control signal read from the second memory means when it is determined that the chip component has contacted the mounting portion, to gradually increase a load applied to the chip component, said control means being independent of the load applied to the chip component.

9. The apparatus according to claim 8, wherein the holding means comprises a vacuum chuck for sucking the chip component.

10. The apparatus according to claim 8, wherein the linear motor is of a voice-coil type.

11. The apparatus according to claim 8, further comprising comparing means connected to the control means and the sensing means for comparing the position control data output from the control means with data corresponding to a signal output from the sensing means, and supplying the linear motor with a voltage corresponding to the comparison result.

12. The apparatus according to claim 8, wherein the position control data is digitized data corresponding to the position of the holding means sensed by the sensing means, and the torque control data is digitized data for gradually increasing pressure applied to the chip component.

13. The apparatus according to claim 12, further comprising:
    first converter for converting the position control data which is output from the control means, into a voltage; and
    second converter for converting the torque control data which is output from the control means, into a voltage.

14. A mounting apparatus for mounting a chip component on a mounting portion of a base member, comprising:
    holding means for holding the chip component;
    a linear motor for moving the holding means toward the mounting portion of the base member;
    position control means for controlling the position of the linear motor; and
    torque control means for controlling the torque of the linear motor;
    wherein the position control means determines, at the time of mounting the chip component held by the holding means onto the mounting portion of the base member, whether or not the chip component on the holding means has contacted the mounting portion of the base member, the control means gradually increasing the torque of the linear motor when it is determined that the chip component has contacted the mounting portion, to gradually increase a load applied to the chip components, said control means being independent of the load applied to the chip component.

15. The apparatus according to claim 14, wherein the holding means comprises a vacuum chuck for sucking the chip component.

16. The apparatus according to claim 14, wherein the linear motor is of a voice-coil type.

17. A method of controlling a load applied to a chip component when the chip component is mounted onto a mounting portion of a base member, comprising the steps of:
    bringing the chip component which is held by a holding means, into contact with the mounting portion of the base member, by means of a linear motor; and
    gradually increasing the torque of the linear motor independent of the load applied to the chip component to thereby gradually increase a load applied to the chip component, when the chip component has contacted the mounting portion of the base member.

* * * * *